United States Patent

Sasano

[11] Patent Number: 5,583,756
[45] Date of Patent: Dec. 10, 1996

[54] TEACHING METHOD AND TEACHING SYSTEM FOR A BONDING COORDINATE

[75] Inventor: Toshiaki Sasano, Sagamihara, Japan

[73] Assignee: Kabushiki Kaisha Shinkawa, Tokyo, Japan

[21] Appl. No.: 342,426

[22] Filed: Nov. 18, 1994

[30] Foreign Application Priority Data

Nov. 18, 1993 [JP] Japan ................................... 5-311027

[51] Int. Cl.$^6$ ........................... G05B 19/18; B23Q 17/22
[52] U.S. Cl. ........................ 364/167.01; 364/192; 228/9
[58] Field of Search ............................. 364/167.01, 191, 364/192, 468, 491; 228/4.5, 9; 356/375; 29/840, 843

[56] References Cited

U.S. PATENT DOCUMENTS

| | | | |
|---|---|---|---|
| 4,155,650 | 5/1979 | Yasue et al. | 356/400 |
| 4,253,111 | 2/1981 | Funk et al. | 358/101 |
| 4,669,866 | 6/1987 | Phillips | 355/43 |
| 5,113,565 | 5/1992 | Cipolla et al. | 29/25.01 |
| 5,126,823 | 6/1992 | Otsuka et al. | 357/70 |
| 5,150,828 | 9/1992 | Shimizu | 228/102 |
| 5,292,050 | 3/1994 | Nagaoka et al. | 228/4.5 |
| 5,456,403 | 10/1995 | Nishimaki et al. | 228/102 |
| 5,458,280 | 10/1995 | Nishimaki et al. | 228/102 |

Primary Examiner—Paul P. Gordon
Attorney, Agent, or Firm—Koda and Androlia

[57] ABSTRACT

A system for teaching bonding coordinates of pads provided on a semiconductor chip including: a first arithmetic control unit for processing images of pads obtained by a camera and calculates the amount of shift of centers of the images of the pads; and a second arithmetic control unit which, for the first and second pads, corrects the bonding coordinates, thus producing new bonding coordinates for the first and second pads, and for the third and subsequent pads, the second arithmetic control unit moves the camera a distance between new coordinates of two preceding pads and corrects the coordinates of the moved camera, producing new bonding coordinates to be stored in a bonding coordinate memory.

2 Claims, 4 Drawing Sheets

TEACHING METHOD AND TEACHING SYSTEM FOR A BONDING COORDINATE

BACKGROUND OF THE INVENTION

1. Field of the Invention

The present invention relates to a bonding coordinate teaching method and system used in a wire bonding apparatus.

2. Prior Art

A workpiece 3 shown in FIG. 5 includes a semiconductor chip 2 bonded to a lead frame 1 via wires 4. The wires 4 are connected between the pads $P_1$, $P_2$ ... of the semiconductor chip 2 and the leads $L_1$, $L_2$ ... of the lead frame 1. The bonding between the pads and the leads via the wires is accomplished by a wire bonding apparatus which is, for example, shown in FIG. 6.

Generally, when the wire bonding is executed, any positional discrepancy between the semiconductor chip and the lead frame is first corrected. The correction is made in the following manner: First, a shift or deviation between at least two points on a semiconductor chip and at least two points on a lead frame from a datum position is detected, and then the bonding coordinates stored beforehand in the memory of a bonding apparatus are corrected by an arithmetic unit based upon the detected values of the shift.

More specifically, when the shift or discrepancy detection is performed by a camera, as seen in FIG. 6, an X-axis motor 12 and a Y-axis motor 13 are driven so that the central (or optical) axis 11a of the camera 11 is positioned directly above the point to be detected. After the bonding coordinates have been corrected as described above, a capillary 15 is moved in the X, Y and Z directions so as to be above the point to be detected, and then the wire 4 which is passed through the capillary 15 is wire-bonded.

In this case, the central axis 11a of the camera 11 is provided at an offset position relative to the central axis 15a of the capillary 15 by a distance of W so that the XY table 16 is moved by an offset amount of W by the X-axis motor 12 and Y-axis motor 13 so that the capillary 15 is positioned above the first bonding point.

Afterward, the wire 4 is wire-bonded at the corrected bonding coordinate by moving the XY table in the X and Y directions by the X-axis motor 12 and Y-axis motor 13, and by further moving the capillary 15 in the Z direction by the vertical movement (or pivoting) of the capillary arm 17 that is effected by the Z-axis motor 14.

In the above, the offset amount W is shown by Equation 1 below, wherein Xw is the X-axis component, and Yw is the Y-axis component:

[Equation 1]

$$W = (Xw^2 + Yw^2)^{1/2}$$

In the wire bonding method described above, it is necessary to input the respective bonding coordinates into the memory of the bonding apparatus before the wire bonding operation is executed. The input of such is also necessary when the type of workpiece to be processed is changed. The input into the bonding apparatus as described above is generally accomplished by a teaching method.

The existing teaching method used for the respective bonding coordinates of the pads $P_1$, $P_2$ ... is performed by the following steps:

(1) a manual input means such as a ten-key, chessman, etc., which moves the X-axis motor 12 and Y-axis motor 13, is manually operated by an operator so that the coordinates $(x_1, y_1)$ of the first pad $P_1$ are inputted. Such coordinates are shown on a television monitor, (2) then while viewing the monitor screen, the operator operates the manual input means so that the position that is thought to be the center of the pad $P_1$ is aligned with cross-hairs shown in the center of the monitor screen, and this coordinate position is stored in the memory of the bonding apparatus, (3) the operation described above is performed for all of the pads $P_1$, $P_2$ ....

In the above described prior art method, teaching of the bonding coordinates is accomplished by the operator who operates the manual input means in accordance with a predetermined order, and the alignment operation is performed a number of times that is equal to the number of pairs of coordinates to be stored in the memory.

Due to such complex operations, several problems arise. The operation requires a considerable amount of time, and positioning errors would occur as a result of mistakes made by operators, particularly by individual differences between the operators. Furthermore, in such a manual input, the resolution of the object image solely depends upon the resolution of the monitor; and as a result, positions finer than what appears on the monitor screen is not able to be judged. Thus, the positioning precision ought to depend upon the pixel or picture element units of the monitor.

SUMMARY OF THE INVENTION

Accordingly, the object of the present invention is to provide a bonding coordinate teaching method and teaching system which shortens the operating time, improves the positioning precision and solves all the problems seen in the prior art.

The object of the present invention is accomplished by a unique bonding coordinate teaching method for a wire bonding apparatus that includes: a capillary which performs wire bonding on workpieces in which semiconductor chips are to be bonded to lead frames, a camera which is provided at an offset position relative to the capillary, and an XY table which moves the capillary and camera together in the X and Y directions, and the teaching method is accomplished by the following steps:

(1) for the first and second pads:
the camera is moved manually using a manual input means so that the camera positions directly above the first and second pads, thus inputting the bonding coordinates of the first and second pads;
the amount of shift of the centers of the images of the first and second bonding pads obtained by the camera is calculated by an arithmetic control (or image control) unit (CPU);
the first and second bonding coordinates inputted manually are corrected, using another arithmetic control (or drive control) unit (CPU), based upon the amount of the shift of the centers of the images of the pads, thus forming new bonding coordinates for the first and second pads and storing them in a bonding coordinate memory; and in addition, (2) for the third pad:
the difference between the two new bonding coordinates (for the first and second) pads is calculated by the drive control unit so as to move the camera the distance equal to such difference;

the shift of the center of the third pad image obtained by the camera is calculated by the image control unit so that the coordinates to which the camera has been moved are corrected, using the drive control unit, based upon the amount of the shift of the center of the image of the third pad, thus forming new bonding coordinates (for the third pad) and storing them in the bonding coordinate memory; and (3) for the all subsequent pads (fourth pads and on), the steps above are repeated.

In other words, for the third and all subsequent pads, the difference between two new bonding coordinates for the immediately preceding two pads is calculated by the drive control unit, the camera is moved the distance that corresponds to the thus calculated difference, the amount of shift of the center of the image of the target pad (that is, the third and each of the subsequent pads) obtained by the thus moved camera is calculated by the image control unit, and the coordinates to which the camera has been moved are corrected by the drive control unit based upon the amount of shift of the center of the image, thus forming the next new bonding coordinates (for the third and so on pads) and storing them in the bonding coordinate memory.

Furthermore, the object of the present invention is accomplished by a unique structure for a wire bonding system which includes: a capillary that performs wire bonding on workpieces in which semiconductor chips are to be bonded to lead frames, a camera that is provided at an offset position relative to the capillary, .and an XY table that moves the capillary and camera together in the X and Y directions, and the bonding system further includes (a) an image processing section which is provided with an arithmetic control (or image control) unit, (b) a main drive section which is provided with an arithmetic control (or drive control) unit, and (c) a bonding coordinate memory, and wherein:

(a) the image control unit (CPU) of the image processing section processes the images obtained by the camera and then calculates the amount of shift of the centers of the images of the target pads;

(b) the drive control unit of the main drive section functions such that for the first and second pads, the camera is moved to positions directly above the pads by a manual input means and the bonding coordinates of the first and second pads are inputted, then the inputted bonding coordinates are corrected based upon the amount of shift of the centers of the images calculated by the image control unit, thus forming new bonding coordinates for the first and second pads; and for the third and all the subsequent pads, the difference between the new bonding coordinates for the preceding two pads (that is, the coordinates of the first and second pads if the third pad is a target pad) are calculated, the camera is moved a distance that corresponds to the thus calculated difference of preceding coordinates, and the coordinates to which the camera has been moved are corrected based upon the amount of shift of the center of the image of the target pad calculated by the image control unit, thus forming next new bonding coordinates (for the third and the following pads), and (c) the bonding coordinate memory stores new bonding coordinates one after another for the subsequent pads.

In the present invention described above, for the first and second pads, the camera is moved to positions directly above these pads using the manual input means, and the coordinates thereof are inputted, so that the respective amounts of shift of the centers of the first and second pads are calculated by the image control unit. Then, the drive control unit corrects the inputted coordinates based upon the shifts of the centers of the pads from the center of the cross line mark of the monitor screen, and these corrected coordinates are stored in the bonding coordinate memory as respective new bonding coordinates for the first and second pads. For the third and all subsequent pads, there is no need to manually input the coordinates of those pads (because the distance between the subsequent pads is substantially the same as that between the first and second pads); instead, the drive control unit performs automatic processing using the new bonding coordinates for the immediately preceding two pads (that is, the first and second pads for the third pads). In other words, for the third and all subsequent pads, the camera is moved the distance equal to the new two bonding coordinates, and the center shift of the target pad which will be handled is calculated by the image control unit, the coordinates to which the camera has been moved are corrected based upon the center shift, and such corrected coordinates are stored in the bonding coordinate memory as the next new bonding coordinates.

DETAILED DESCRIPTION OF THE INVENTION

One embodiment of the present invention will be described below with reference to FIGS. 1 through 6.

Figure 1:
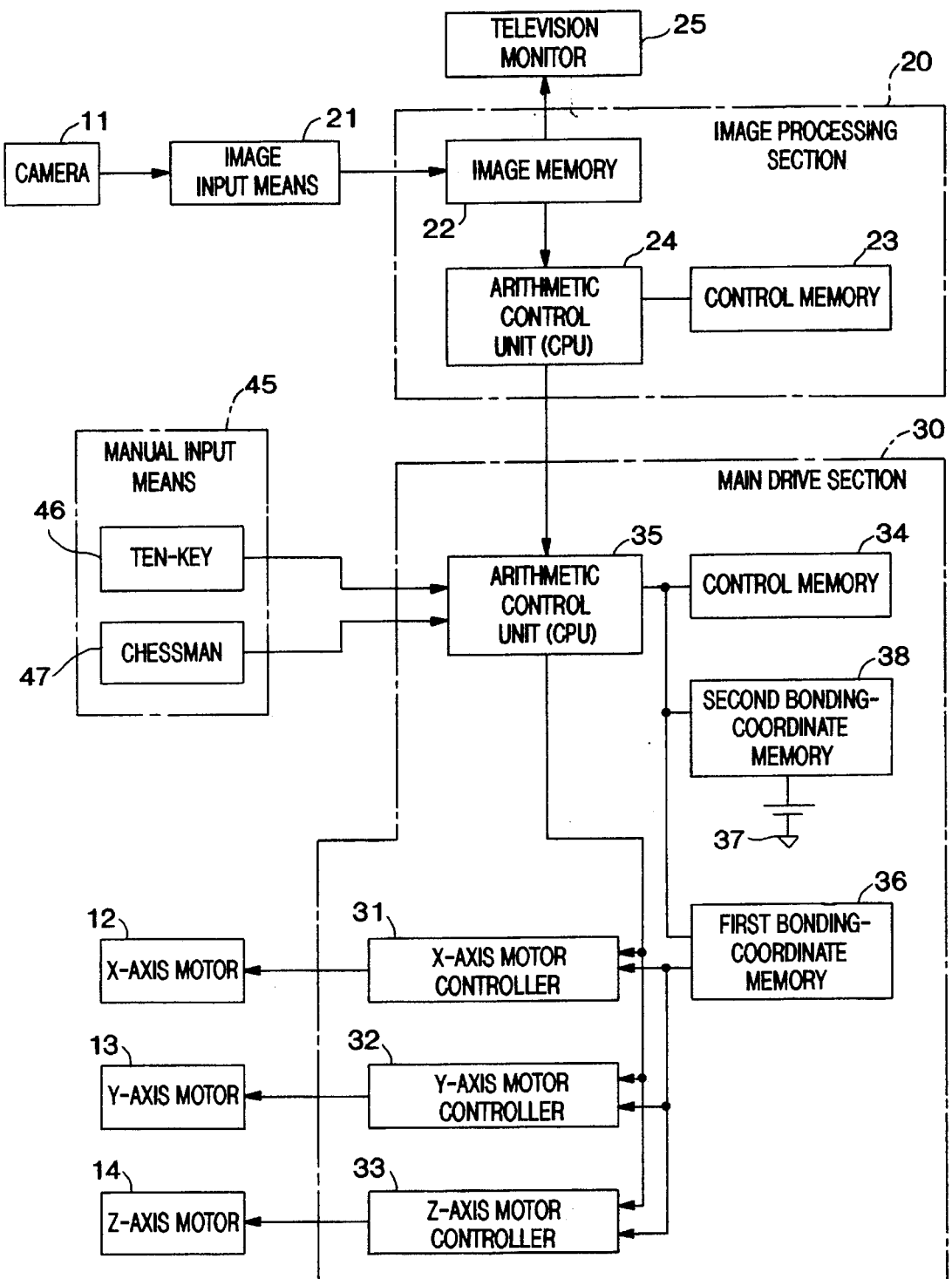
FIG. 1 is a block diagram of the structure of one embodiment of the control circuit used in the teaching method of the present invention.
Figure 6:
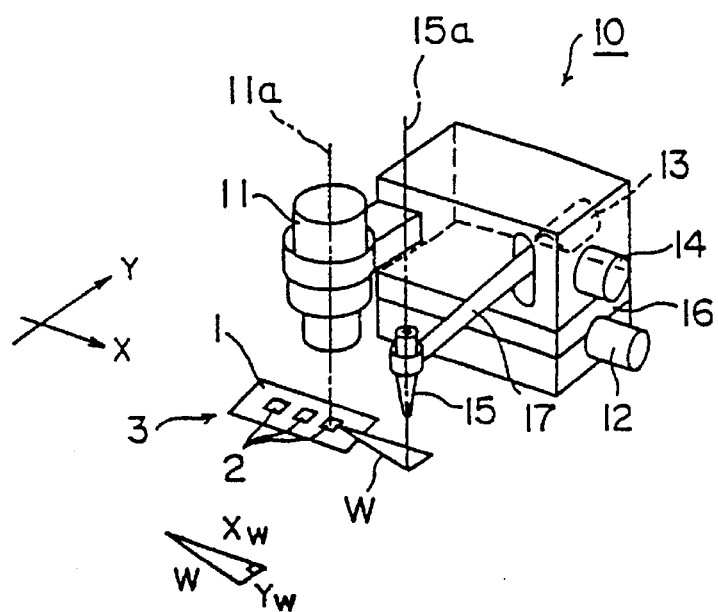
FIG. 6 is a perspective view of one example of a wire bonding apparatus.

As shown in FIG. 1, the primary circuit that executes the teaching of the present invention substantially includes: an image processing section 20 which processes the images of pads obtained by a camera 11; a main drive section 30 which actuates the wire bonding apparatus 10 shown in FIG. 6; and a manual input means 45 which is used for manually inputting data such as coordinates, etc. into the main drive section 30.

The image processing section 20 comprises:

an image memory 22 that stores images inputted through the camera 11 via an image input means 21, a control memory 23 in which an image processing step of the image memory 20 is stored, and an arithmetic control unit (or image control unit) 24 that is a CPU and processes the images stored in the image memory 22 in accordance with the image processing step stored in the control memory 23 and calculates the center shifts of the images.

The images in the image memory 22 are displayed on a television monitor 25.

The main drive section 30 comprises:

an X-axis motor controller 31, Y-axis motor controller 32 and Z-axis motor controller 33 that respectively control the X-axis motor 12, Y-axis motor 13 and Z-axis motor 14, a control memory 34 in which the bonding coordinate calculation steps and control steps for the X-axis motor controller 31, Y-axis motor controller 32 and Z-axis motor controller 33 are stored, an arithmetic control unit (or drive control unit) 35 that is a CPU and controls the X-axis motor controller 31, Y-axis motor controller 32, Z-axis motor controller 33 and control memory 34, the arithmetic control unit 35 controlling the actual bonding coordinates based upon the center shifts calculated by the image control unit 24 and further controlling the bonding coordinate data inputted by the manual input means 45, a first bonding coordinate memory 36 that stores the bonding coordinates calculated by the drive control unit 35, and a second bonding coordinate memory 38 that is backed-up by a battery back-up 37 and stores the same data as in the first bonding coordinate memory 36.

The first and second bonding coordinate memories 36 and 38 of the main drive section 30 store the offset value W expressed by Equation 1 which is shown in the "Prior Art" section.

The manual input means 45 is a ten-key 46, a chessman 47 or any other input devices. The coordinates are inputted into the main drive section 30 using the manual input means 45.

The bonding coordinate teaching method will be described below in accordance with one embodiment of the present invention.

In this embodiment, a first group of pads $P_1$ through $P_4$, a second group of pads $P_5$ through $P_8$, a third group of pads $P_9$ through $P_{12}$, and a fourth group of pads $P_{13}$ through $P_{16}$, in which the respective pads are lined-up in one direction, are processed at once. In other words, the pads in each group are handles together.

Figure 2:
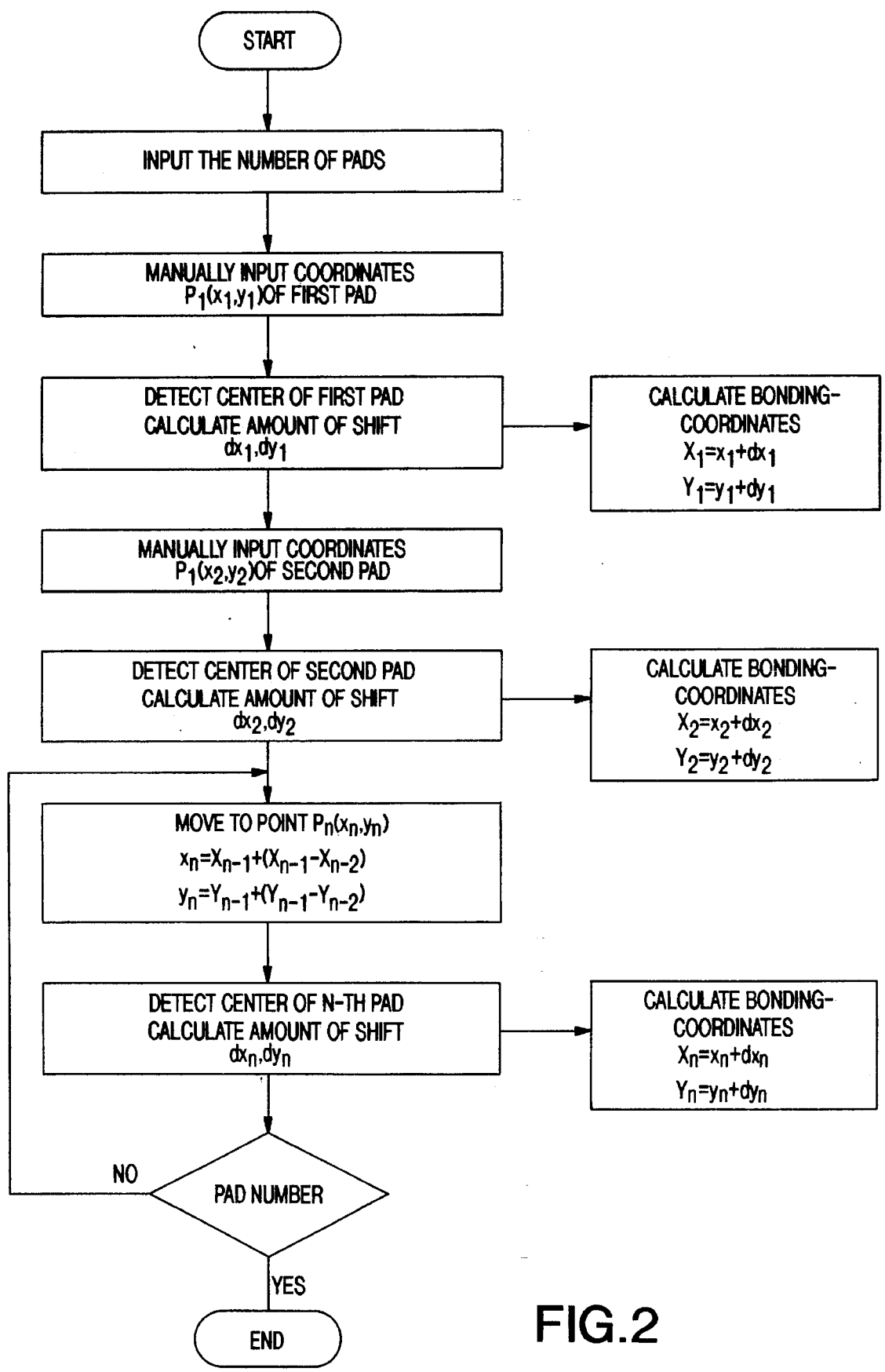
FIG. 2 is a flow chart showing one embodiment of the teaching method of the present invention.

First, the teaching method for pads $P_1$ through $P_4$ of the first group will be described with reference to FIG. 2.

(1) The number of the pads $P_1$ through $P_4$, i.e., 4, is inputted first. In other words, the number of the pads "4" is inputted to the drive control unit 35 of the main drive section 30 using the manual input means 45.

(2) Next, the XY table 16 is moved using the manual input means 45 so that the camera 11 is positioned directly above the first pad $P_1$, and the coordinates of the pad $P_1(x_1, y_1)$ are inputted into the drive control unit 35 of the main drive section 30. As a result, the image of the first pad $P_1$ is obtained via the camera 11. This image thus obtained is converted into a digital signal by the image input means 21 and then stored in the image memory 22. The shape of the image stored in the image memory 22 is subjected to image processing by the image control unit 24 of the image control section 20, and the amount of the center shift of the first pad $P_1$ is calculated.

Figure 3:
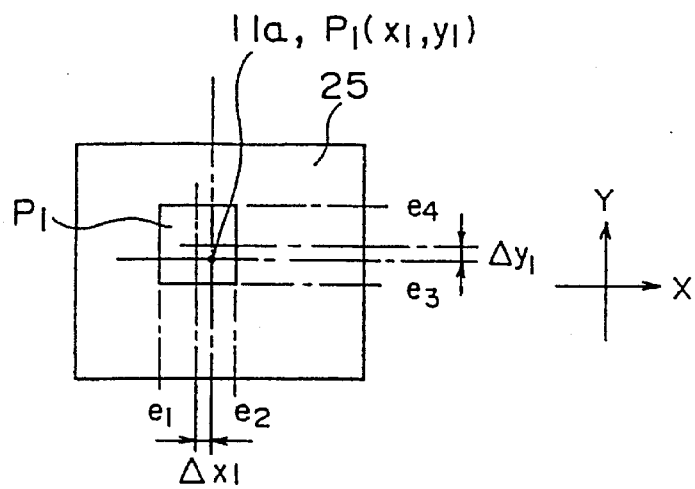
FIG. 3 shows one example of the television monitor image.
Figure 4:
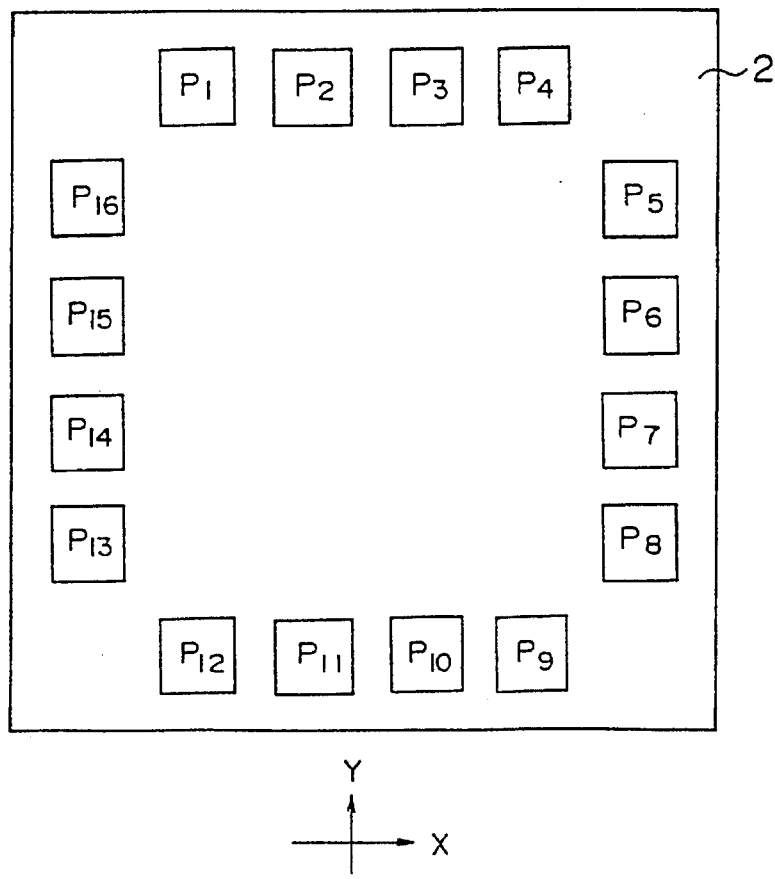
FIG. 4 is an enlarged top view of the semiconductor chip shown in FIG. 5.
Figure 5:
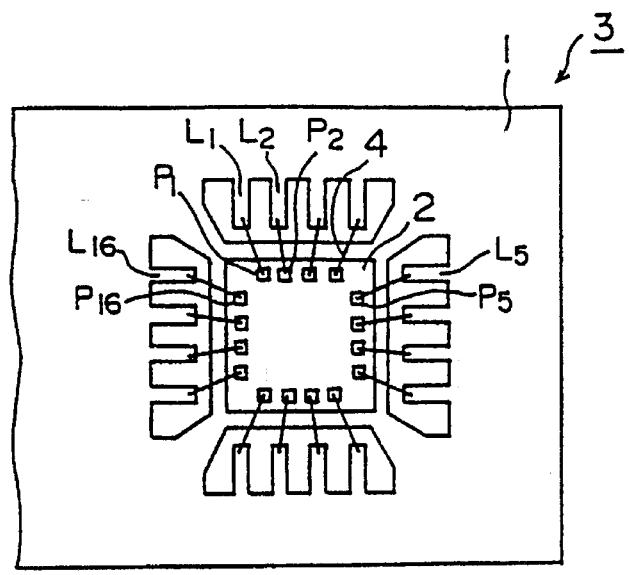
FIG. 5 is a top view of one example of a workpiece.

FIG. 3 shows the image of the first pad $P_1$ displayed on the television monitor 25.

Based upon this image of the pad, the edge positions $e_1$ and $e_2$ of the first pad $P_1$ in the direction of the X axis and the edge positions $e_3$ and $e_4$ of the first pad P1 in the direction of the Y axis are calculated by the image control unit 24. The method for calculating these edge positions $e_1$ through $e_4$ is known to the artisans of the related art. In this case, the coordinates of the calculated positions can be detected with sub-pixel precision. It is known that points with maximum correlation values can be found with the sub-pixel precision by using hill-climb techniques and inter-polation, etc. in addition to a multiple-value (graded image) correlation treatment.

The image control unit 24 calculates the edges $e_1$ through $e_4$ and further calculates the amount of shift $\Delta x_1$, $\Delta y_1$ from the central axis 11a of the camera 11 (image center), i.e., from the manually inputted coordinates $(x_1, y_1)$ of the first pad $P_1$, to the center of the first pad $P_1$ using Equation 2 below.

[Equation 2]

$$\Delta x_1 = x_1 - (e_2 - e_1)/2$$

$$\Delta y_1 = y_1 - (e_4 - e_3)/2$$

The amount of shift $\Delta x_1$, $\Delta y_1$ is determined as numbers of pixels in the image memory 22. Since the actual dimension per pixel (in other words, the amount of movement of the XY table 16) according to the magnification of the camera 11 is a value which is peculiar to the devices (that is, camera 11, image input means 21 and image processing section 20) being used, the shift can be converted into an amount of movement of the XY table 16. Here, where kx and ky are the coefficients of the conversion, the amount of actual-dimensional shift $(dx_1, dy_1)$ in terms of actual dimensions can be calculated using Equation 3, and the central coordinates $(X_1, Y_1)$ of the pad $P_1$ is calculated using Equation 4. The amount of actual-dimensional shift $(dx_1, dy_1)$ and the central coordinates $P_1(X_1, Y_1)$ are stored in the first bonding coordinate memory 36 as the bonding coordinates for the first pad $P_1$.

[Equation 3]

$$dx_1 = kx \cdot \Delta x_1$$

$$dy_1 = ky \cdot \Delta y_1$$

[Equation 4]

$$X_1 = x_1 + dx_1$$

$$Y_1 = y_1 + dy_1$$

Next, the XY table 16 is moved by the manual input means 45 so that the camera 11 is positioned directly above the second pad $P_2$, and the coordinates $(x_2, y_2)$ of the second pad $P_2$ are inputted into the drive control unit 35. As in the case of the first pad $P_1$, image processing is performed to the second pad $P_2$, and the amount of shift $(dx_2, dy_2)$ of the coordinates $P_2(x_2, y_2)$ in terms of actual dimensions and the central coordinates $P_2(X_2, Y_2)$ are determined, and such coordinates $(X_2, Y_2)$ for the second pad $P_2$ are stored in the first bonding coordinate memory 36.

Next, the central coordinates $P_3(X_3, Y_3)$ and $P_4((X_4, Y_4)$ of the third and fourth pads $P_3$ and $P_4$ are calculated.

The coordinates of the third pad $P_3$ and all subsequent pads can be automatically calculated without requiring any input step. More specifically, the distances between the first pads $P_1$ and the second pad $P_2$, the distance between the second pads $P_2$ and the third pad $P_3$, and the distance between the third pads $P_3$ and the fourth $P_4$ are substantially the same. Accordingly, it is sufficient if the distance from the second pad $P_2$ to the third pad $P_3$ is a distance within a range which allows the image of the third pad $P_3$ to be obtained by the camera 11 when the camera 11 is moved a distance which is between $(X_2 - X_1)$ and $(Y_2 - Y_1)$ from the central coordinates $P_2(X_2, Y_2)$ of the second pad. The direction in which the camera 11 is moved is judged by the drive control unit 35 so as to be the same as the direction from the first pad $P_1$ to the second pad $P_2$, and the drive control unit 35 acts accordingly. Consequently, the drive control unit 35 calculates the coordinates $P_3$ ($x_3$, $y_3$) of the third pad by means of Equation 5 based upon the calculated central coordinates $P_1(X_1, Y_1)$ of the first pad and $P_2(X_2, Y_2)$ of the second pad. Then, the drive control unit 35 drives the X-axis motor 12 and Y-axis motor so that the central axis 11*a* of the camera 11 is moved to the coordinates $P_3$ ($x_3$, $y_3$) of the third pad.

[Equation 5]

$$x_3 = X_2 + (X_2 - X_1)$$

$$y_3 = Y_2 + (Y_2 - Y_1)$$

Next, the actual-dimensional shift ($dx_3$, $dy_3$) and the central coordinates $P_3(X_3, Y_3)$ of the third pad are determined by the same processing as for the firs and second pads, and such central coordinates for the third pad are stored in the first bonding coordinate memory 36.

The processing to the fourth pad $P_4$ and the succeeding pads is performed in the same manner as for the third pad $P_3$. Accordingly, a description of the processing to the fourth and the following pads is omitted.

As seen from the above, coordinates Pn (xn, yn) proceeding to a n-th pad are expressed by Equation 6, and the actual-dimensional shift (dxn, dyn) and the central coordinates (Xn, Yn) of the n-th pad Pn are expressed by Equations 7 and 8, respectively, in which ($\Delta xn$, $\Delta yn$) is the n-th pad's shift.

[Equation 6]

$$xn = Xn-_1 + (Xn-_1 - Xn-_2)$$

$$yn = Yn-_1 + (Yn-_1 - Yn-_2)$$

[Equation 7]

$$dxn = kx \cdot \Delta xn$$

$$dyn = ky \cdot \Delta yn$$

[Equation 8]

$$Xn = xn + dxn$$

$$Yn = yn + dyn$$

The teaching method for the fifth pads $P_5$ through the eighth $P_8$ is executed in the same manner as for the first through fourth pads $P_1$ through $P_4$. In other words, as in the teaching method for the first through fourth pads $P_1$ through $P_4$, processing similar to that performed for the pads $P_1$ through $P_4$ is performed; that is, the coordinates $P_5(x_5, y_5)$ and $P_6(x_6, y_6)$ of pads $P_5$ and $P_6$ are inputted and also the number of the pads $P_5$ through $P_8$ are inputted, and so on.

For the ninth through twelfth pads $P_9$ through $P_{12}$ and the thirteenth through sixteenth pads $P_{13}$ through $P_{16}$, the same processing as for the pads $P_1$ through $P_4$ is performed; accordingly, a description of the processing is omitted here.

As seen from the above, for the pads which are lined up in a row, the respective pad centers are automatically calculated by the image processing section 20, and the bonding coordinates are automatically calculated by the main drive section 30, by merely imaging the first and second pads in the line-up pads by the camera 11 and then inputting the pad coordinates for the first and second pads into the memory.

In other words, according to the present invention, the number of coordinates that must be inputted is reduced, and there is no need to align the centers of the pads with the image cross-hairs. Accordingly, the operating time is greatly reduced, and alignment errors that might be caused by operator mistakes or individual differences between operators are eliminated. Thus, the positional precision of the bonding coordinates is improved.

In addition, the resolution of the television monitor 25 is 6 microns/pixel, and therefore, a manual positioning finer than this cannot be judged. In the present invention, however, the sub-pixel calculation is executable. Accordingly, a detection precision of 1/32 pixel is available, and even if disturbance is included, a precision of 1/4 pixel, i.e., 1.5 microns, is obtained.

As seen from the above, according to the present invention, the respective pad centers are automatically calculated in the image processing section, and the bonding coordinates are calculated by the main drive section by inputting the pad coordinates of the first and second pads of lined-up pads. Accordingly, the operating time is remarkably short, and the positioning precision is improved.

I claim:

1. A bonding coordinate teaching method used in a wire bonding apparatus which includes a capillary performing wire bonding on workpieces in which semiconductor chips having a plurality of pads thereon are bonded to lead frames, a camera installed at an offset position relative to said capillary, and an XY table moving said capillary and camera together in the X and Y directions; wherein (A) teaching for first and second pads is accomplished by a process of (i) moving said camera by a manual input means to positions directly above said pads and bonding coordinates of said pads are inputted into an arithmetic control unit provided in a main drive section, (ii) calculating an amount of shift of centers of images of said first and second bonding pads obtained by said camera by an arithmetic control unit provided in an image processing section, and (iii) correcting said inputted bonding coordinates of said first and second pads by said arithmetic control unit provided in said main drive section based upon an amount of shift of centers of said images, thus producing new bonding coordinates for said first and second pads which are stored in a bonding coordinate memory, and (B) teaching for a third pad and all subsequent pads is accomplished by a process of (i) calculating a difference between (a) new bonding coordinates for a pad immediately preceding a target pad and (b) new bonding coordinates for a pad preceding said pad immediately preceding a target pad by said arithmetic control unit provided in said main drive section, and moving said camera to coordinates that correspond to said difference, (ii) calculating an amount of shift of a center of said target pad obtained by said camera by said arithmetic control unit provided in said image processing section, and correcting coordinates to which said camera has been moved by said arithmetic control unit provided in said main drive section based upon an amount of shift of a center of an image of said target pad, thus producing new bonding coordinates, and (C) storing said new bonding coordinates in said bonding coordinate memory.

2. A bonding coordinate teaching system in a wire bonding apparatus which includes a capillary performing wire bonding on workpieces in which semiconductor chips having pads thereon are bonded to lead frames, a camera installed at an offset position relative to said capillary, and an XY table moving said capillary and camera together in X and Y directions; said teaching system comprising:

(A) an arithmetic control unit provided in an image processing section, said arithmetic control unit for processing images obtained by said camera and for calculating an amount of shift of centers of said images of said pads;

(B) an arithmetic control unit provided in a main drive section, (1) said arithmetic control unit provided in said main drive section for correcting, for first and second pads, as a result of a process in which said camera is moved to a position directly above said first and second pads and bonding coordinates of said first and second pads are inputted by a manual input means, input bonding coordinates based upon an amount of shift of said centers of said images are calculated by said arithmetic control unit provided in said image processing section, thus producing new bonding coordinates for said first and second pads; and (2) said arithmetic control unit provided in said main drive section, for third and all subsequent pads, (i) calculating a difference between (a) new bonding coordinates for a pad immediately preceding a target pad and (b) new bonding coordinates for a pad preceding said pad immediately preceding to a target pad, (ii) moving said camera an amount that corresponds to said difference, and (iii) correcting said coordinates of said moved camera based upon an amount of shift of a center of an image calculated by said arithmetic control unit provided in said image processing section, thus producing new bonding coordinates for said target pad; and (C) a bonding coordinate memory for storing said new bonding coordinates.

* * * * *